United States Patent [19]

Watanabe

[11] Patent Number: 5,132,532
[45] Date of Patent: Jul. 21, 1992

[54] PHOTOELECTRIC CONVERTER MODULE

[75] Inventor: Nobutaka Watanabe, Tokyo, Japan

[73] Assignee: NEC Corporation, Tokyo, Japan

[21] Appl. No.: 669,438

[22] Filed: Mar. 13, 1991

[30] Foreign Application Priority Data

Mar. 13, 1990 [JP] Japan .................. 2-62969

[51] Int. Cl.⁵ .................................................. H01L 31/02
[52] U.S. Cl. ................................. 250/239; 174/52.4; 361/394; 361/419; 361/420; 357/30; 357/74; 357/75
[58] Field of Search .......... 250/239; 357/30 R, 30 L, 357/75, 74; 361/417, 419, 420, 392, 395, 394; 174/52.4, 52.6, 260

[56] References Cited

U.S. PATENT DOCUMENTS 3,151,278 9/1964 Glarde .................. 174/260
4,587,421 5/1986 Robertson .................. 250/239

Primary Examiner—Carolyn E. Fields
Attorney, Agent, or Firm—Foley & Lardner

[57] ABSTRACT

In a photoelectric converter module, a chip carrier which carries a photoelectric converter chip on a side surface thereof is fixed on a metal base of the module via a metal member by means of welding, and the photoelectric converter chip is connected electrically with a pre-amplifier via a conductor pattern provided on a surface of the chip carrier and a bonding wire, so that parasitic capacities generated between the photoelectric converter chip and the pre-amplifier are considerably reduced, and the chip carrier is fixed firmly without causing deviation of an optical axis between the photoelectric converter chip and optical systems including a lens.

6 Claims, 2 Drawing Sheets

PHOTOELECTRIC CONVERTER MODULE

FIELD OF THE INVENTION

This invention relates to a photoelectric converter module, and more particularly to, a photoelectric converter module having a reduced parasitic capacity and less optical deviation.

BACKGROUND OF THE INVENTION

The conventional photoelectric converter module comprises a photoelectric converter chip which converts an optical signal into an electric signal, a chip carrier which carries the photoelectric converter chip on one side surface thereof, a pre-amplifier which amplifies the electric signal, a hybrid integrated circuit (HIC) board on which the chip carrier and the pre-amplifier are mounted, an optical fiber which supplies an optical signal to the photoelectric converter chip, a lens which focuses a light to the photoelectric converter chip, a lens holder which holds the lens, a package member which houses electric elements such as the chip carrier, the HIC board, etc., and a metal cap which seals the electric elements inside the package member.

The chip carrier is provided with conductor patterns on the side and bottom surfaces, and the photoelectric converter chip is attached on the side surrface to be connected to the conductor patterns. On the other hand, the HIC board is provided with conductor patterns on the top surface thereof. The chip carrier is fixed on the HIC board by soldering with a soldering layer, and the HIC board is fixed on the package member by soldering. The photoelectric converter chip is connected electrically with the pre-amplifier via the conductor patterns of the chip carrier, the soldering layer between the chip carrier and the HIC board, and the conductor patterns of the HIC board.

In operation, an optical signal transmitted through the optical fiber is supplied to the photoelectric converter chip through the lens. Then, the optical signal is converted into an electric signal in the photoelectric converter chip, and then transmitted to the pre-amplifier through the conductor patterns of the chip carrier and the conductor patterns of the HIC board, and then the electric signal is amplified by the pre-amplifier.

In the photoelectric converter module, the frequency characteristic depends on an input impedance of the pre-amplifier, a junction capacity Dj of the photoelectric converter chip, and parasitic capacities Ct of the conductor patterns of the chip carrier, the soldering layer, and the conductor patterns of the HIC board.

A trans-impedance type circuit is generally adopted as the pre-amplifier because of having advantages in frequency range characteristic, receiving sensibility and dynamic range. In the photoelectric converter module which requires to operate in a super high speed transmission over 1 Gb/s, a trans-impedance type circuit comprising a GaAs-MESFET is used as the pre-amplifier in order to realize a high receiving sensibility and a wide range characteristic. In this case, the input impedance of the pre-amplifier is relatively high, so that sensibility of the input capacity is high. As a result, the frequency characteristic in the band of 3 dB down practically depends on an input impedance of the pre-amplifier, the junction capacity Cj of the photoelectric converter chip, and the parasitic capacities Ct of the conductor patterns of the chip carrier, the soldering layer and the conductor patterns of the HIC board.

According to the conventional photoelectric converter module, however, there is a disadvantages in that the photoelectric converter module cannot be used in the frequency range over 3 GHz, because parasitic capacities in the conductor patterns of the HIC board and the soldering layer are large.

Furthermore, there is another disadvantage in that the photoelectric converter module has little reliability because of the deviation of an optical axis between the photoelectric converter chip and the optical system including the lens. The deviation is caused by creeping of the soldering layers, one of which fixes the chip carrier on the HIC board and the other fixes the HIC board on the package member. In the fabrication process of the photoelectric converter module, the photoelectric converter chip, that is a photodiode or an avalanche type photodiode, must be protected from a high temperature, which may cause damage to the photoelectric converter chip. For this purpose, the photoelectric converter chip is fixed on the conductor pattern of the chip carrier, for instance, by soldering of Au-Sn alloy which has a melting point of approximately 280° C. In such a case, the soldering material which is used for fixing the chip carrier on the HIC board and fixing the HIC board on the package member must have a melting point lower than that of Au-Sn alloy to avoid the softening of the Au-Sn alloy solder, resulting in the collapse of the fixing of the photoelectric converter chip on the conductor pattern. As a result, the creeping of the soldering layers may occur, because it tends to occur more often as a melting point thereof lowers.

SUMMARY OF THE INVENTION

Accordingly, it is an object of the invention to provide a photoelectric converter module which can be used even in the frequency range over 3 GHz.

It is a further object of the invention to provide a photoelectric converter module which has a high reliability.

According to a feature of the invention, a photoelectric converter module comprises:

a photoelectric converter chip to convert an optical signal into an electric signal;

a chip carrier which carries the photoelectric converter chip, the chip carrier comprising a ceramic member having a square pillar shape which carries the photoelectric converter chip on a side surface thereof, a conductor pattern continually provided on the side surface and a top surface of the ceramic member, and a metal member on which the chip carrier is fixed;

a pre-amplifier which is connected with the conductor pattern of the chip carrier via a bonding wire to amplify the electric signal converted by the photoelectric converter chip; and a metal base on which the metal member of the chip carrier is fixed by laser welding and the pre-amplifier is fixed.

BRIEF DESCRIPTION OF THE DRAWINGS

The invention will be explained in more detail in conjunction with appended drawings wherein.

DESCRIPTION OF THE PREFERRED EMBODIMENTS

Before describing a photoelectric converter module in a preferred embodiment according to the invention, the conventional photoelectric converter module briefly described before will be explained in conjunction with FIG. 1.

Figure 1:
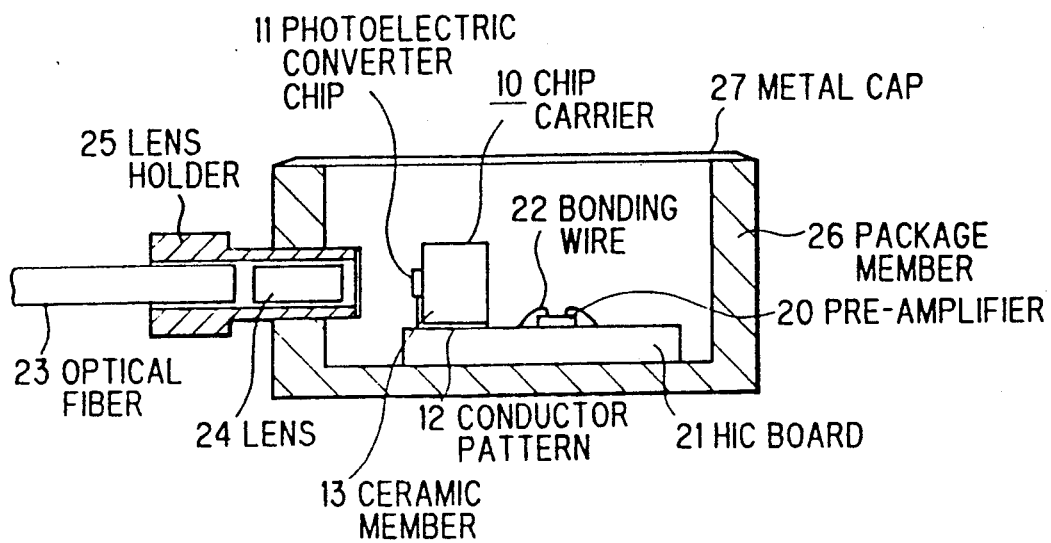
FIG. 1 is a cross-sectional view illustrating a conventional photoelectric converter module.

In FIG. 1, a photoelectric converter chip 11 is attached to a side surface of a chip carrier 10 which is fixed on an HIC board 21 by soldering with a soldering layer (not shown in FIG. 1). The HIC board 21 is fixed on a package member 26 by soldering. A pre-amplifier 20 which is mounted on the HIC board 21 is connected with the photoelectric converter chip 11 electrically by a conductor pattern 12 provided on the surface of the chip carrier 10, a conductor pattern (not shown in FIG. 1) provided on the surface of the HIC board 21 and a bonding wire 22. An optical fiber 23 is provided for supplying an optical signal to the photoelectric converter chip 11 through a lens 24 which is held by a lens holder 25. A package member 26 houses electric elements such as the chip carrier 10, the HIC board 21, etc. A metal cap 27 seals the electric elements inside the package member 26.

Figure 2:
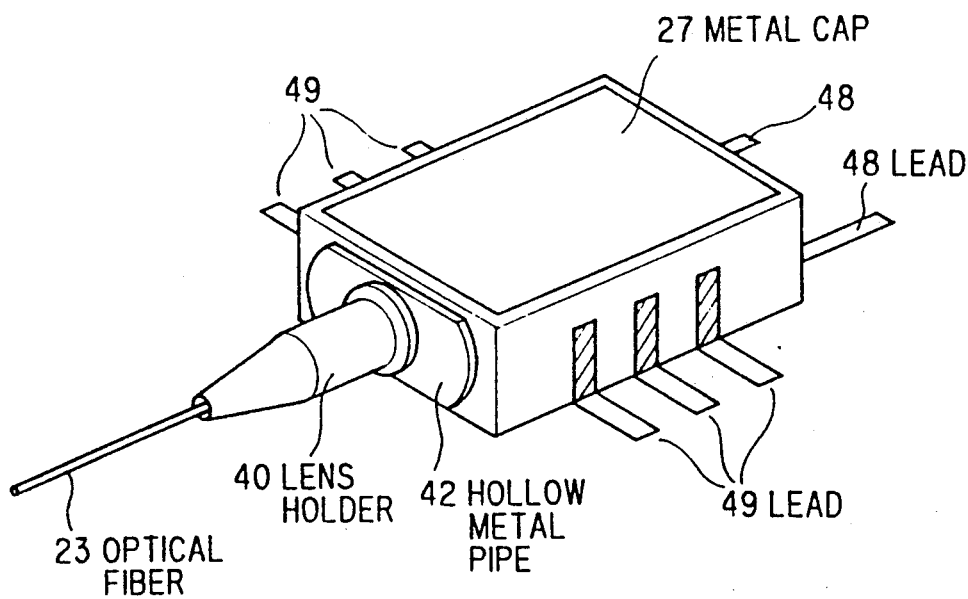
FIG. 2 is a perspective view illustrating a photoelectric converter module in a preferred embodiment according to the invention.
Figure 3:
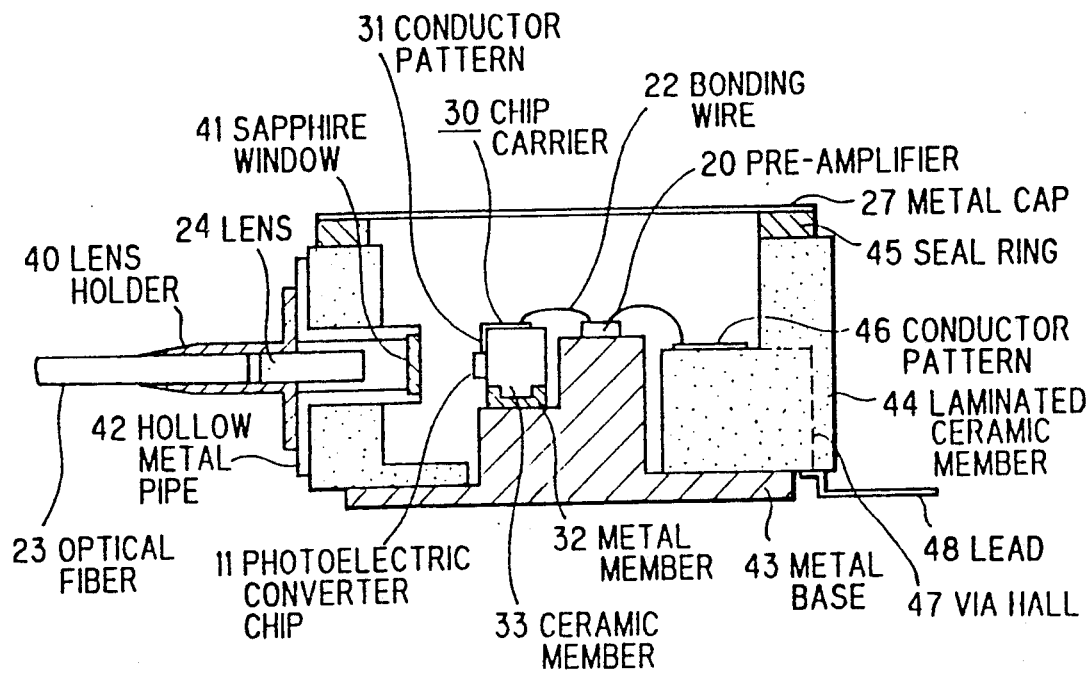
FIG. 3 is a cross-sectional view illustrating the photoelectric converter module in the preferred embodiment according to the invention.
Figure 4A:
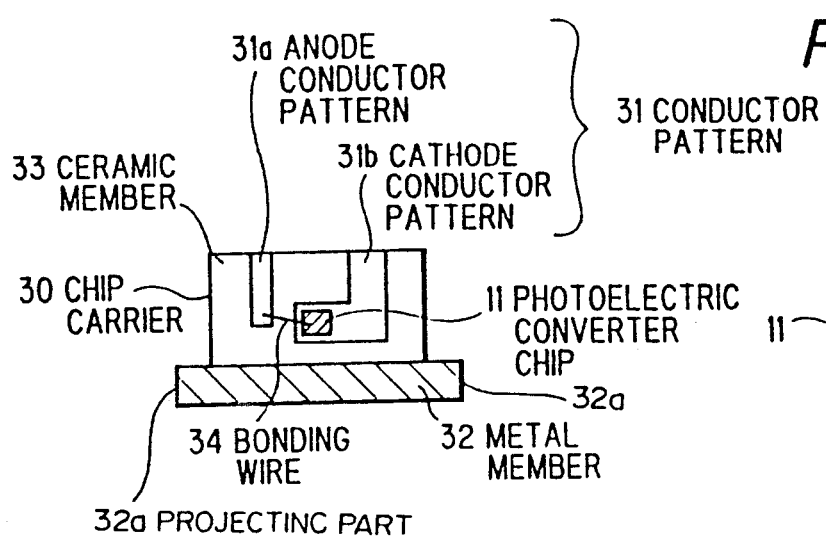
FIGS. 4A and 4B are respectively a plan view and a side view illustrating a chip carrier in the photoelectric converter module in the preferred embodiment according to the invention.
Figure 4B:
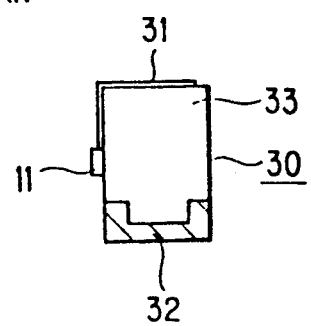

Next, FIGS. 2 and 3 are respectively a perspective view and a cross-sectional view illustrating a photoelectric converter module in a preferred embodiment according to the invention, and FIGS. 4A and 4B are respectively a plan view and a side view illustrating a photoelectric converter chip carrier 30 in FIG. 3, wherein like parts are indicated by like reference numerals as used in FIG. 1.

In the photoelectric converter module, a chip carrier 30 to which a photoelectric converter chip 11 is attached on a side surface thereof and a pre-amplifier 20 are fixed on a metal base 43. The photoelectric converter chip 11 and the pre-amplifier 20 are connected each other electrically by conductor patterns 31 provided on the surface of the chip carrier 30 and a bonding wire 22. An optical fiber 23 is provided for supplying an optical signal to the photoelectric converter chip 11 through a lens 24 which is held by a lens holder 40 and a sapphire window 41 which is held by a hollow metal pipe 42. A laminated ceramic member 44 houses electric elements such as the chip carrier 30. And a seal ring 45 and a metal cap 27 seal the electric elements inside the laminated ceramic member 44.

The chip carrier 30 (FIGS. 4A and 4B) comprises a ceramic member 33 which has a square pillar shape, a metal member 32 which consists of the same material as the metal base 43 and has the same thermal expansion coefficient as that of the ceramic member 33. The photoelectric converter chip 11 is attached to the ceramic member 33 on a side surface which faces an optical system comprising the optical fiber 23, the lens 25 and the sapphire window 41. The ceramic member 33 is provided with an anode conductor pattern 31a which is connected with an anode terminal of the photoelectric converter chip 11 via a bonding wire 34, and a cathode conductor pattern 31b on which the photoelectric converter chip 11 is mounted and which is connected with a cathode terminal of the photoelectric converter chip 11.

In the preferred embodiment, the ceramic member 33 consists of alumina ceramic material, and the metal member 32 consists of alloy of Fe, Ni and Co which is the same material as that of the metal base 43. The ceramic member 33 has 1.5 mm square in cross-sectional area and 3 mm in height. On the other hand, the metal member 32 has 5 mm in length and 0.5 mm in thickness. The ceramic member 33 is fixed on the center of the top surface of the metal member 33 by hard soldering of Ag, so that each of the both side ends of the metal member 33 projects by 1 mm from the ceramic member 32.

The fabrication process of the chip carrier 30 will be explained. First, alumina ceramic powder is poured into a metal mold and plastic process of the powder is carried out under a predetermined pressure, and then the product of the plastic process is burned at 1200° to 1400° C. to provide a square pillar ceramic member. After that, the ceramic member is coated with tungsten, and then the ceramic member is fixed on a metal member by hard soldering of Ag at 850° to 900° C. The ceramic member is plated with Ni and then with Au, and the photolithography process is carried out to obtain conductor patterns. Next, the photoelectric converter chip 11 is fixed on the predetermined position of the cathode conductor pattern 31b by soldering of Au-Sn alloy, so that the cathode terminal of the photoelectric converter chip 11 is connected electrically. The anode terminal of the photoelectric converter chip 11 is connected with the anode conductor pattern 31a by the bonding wire 22 made of Au.

The chip carrier 30 thus fabricated is fixed on the metal base 43 by welding using YAG (yttrium, aluminum and garnet) laser at the both projecting parts 32a of the metal member 32. Each of the projecting parts 32a has a notch (cutting portion) having approximately 0.3 mm width through which the passing through welding using YAG laser is carried out.

The pre-amplifier 20 is fixed on the metal base 43 by soldering of Au-Sn alloy. The pre-amplifier 20 is connected with the conductor patterns 31, conductor pattern 46 on the laminated ceramic member 44, and a power supply (not shown in FIG. 3) by Au bonding wires 22, and is connected with a lead 48 provided outside of the package by the conductor pattern 46 and a via hall 47 passing through the laminated ceramic member 44.

The fabrication process of the module package will be explained. First, the laminated ceramic member 44 is fabricated. The laminated ceramic member 44 consists of a plurality of green sheets made of alumina ceramic material which is generally used for package material, each of the green sheets having a predetermined thickness, that is approximately 0.2 mm for instance. Each sheet is provided with predetermined metal patterns, that is tungsten (W) patterns in the preferred embodiment. The green sheets are formed to have predetermined shapes, and then laminated and burned at 1200° to 1400° C. to obtain a laminated ceramic member having a predetermined package form. Next, the laminated ceramic member 44 thus fabricated, the metal base 43, the seal ring 45 and the hollow metal pipe 42 are fixed each other by hard soldering of Ag, and then the package thus formed is plated with Ni, and then with Au. After that, the sapphire window 41 is fixed at a predetermined place of the hollow metal pipe 42 by hard soldering, that is by hard soldering of Au-Sn alloy having a melting point of approximately 280° C. in the preferred embodiment.

The sapphire window 41 is used for transmitting the optical signal supplied from the optical fiber 23 to the photoelectric converter chip 11 while keeping an airtightness of the internal space of the package. The sapphire window 41 is coated with a reflect-free layer (anti-reflection coat) consisting of plural layers of dielectric to reduce the remaining reflection rate below 2% in the practical wavelength of the optical signal.

The chip carrier, 30 is housed into the package using a clamp tool to mount on the metal base 43, and the position of the chip carrier 30 is adjusted so that the optical axis between the center of the sapphire window 41 and that of a optical receiving surface of the photoelectric converter chip 11 are aligned. After that, the chip carrier 30 is fixed with the metal base 43 by welding using the YAG laser as described before. Then, electrical elements such as the photoelectric converter chip 11, the pre-amplifier 20, etc., are connected each other electrically by wire bonding. After that, the package is sealed with the metal cap 27 in non-active gas, that is dry nitrogen in the preferred embodiment.

In operation, an optical signal transmitted through the optical fiber 23 is supplied to the photoelectric converter chip 11 through the lens 25 and the sapphire window 34. Then, the optical signal is converted into an electric signal in the photoelectric converter chip 11, and then transmitted to the pre-amplifier 20 through the conductor patterns 31 and the bonding wire 22, and then the electric signal is amplified in the pre-amplifier 20. Thus amplified electric signal is transmitted to the lead 48 to be supplied to an external circuit.

In the structure of the photoelectric converter module thus explained, parasitic capacities between the photoelectric converter chip 11 and the pre-amplifier 20 are considerably reduced to become 0.2 to 0.3 pF which is approximately one third of that of the conventional photoelectric converter module, so that the photoelectric converter module can be used in the high frequency band over 3 GHz on a condition of 3 dB down. The parasitic capacities may be reduced by narrowing the width of the anode conductor pattern 31a.

In the preferred embodiment, the chip carrier 30 is fixed on the metal base 43 by welding using YAG laser as explained before, so that there occurs no deviation of the optical axis between the optical system including the lens 25 and the photoelectric converter chip 11. As a result, the reliability of the photoelectric converter module is much improved. Additionally, the fabrication process becomes easy to be carried out, because the adjustment of the position of the chip carrier 30 to adjust the optical axis between the optical system and the photoelectric converter chip 11 and the fixing of the chip carrier 30 on the metal base 43 are easily carried out.

In the preferred embodiment, the metal member 32 and the metal base 43 consist of the same material, that is alloy of Fe, Ni and Co, and the alloy of Fe, Ni and Co and alumina ceramic material which is the material of the chip carrier have coefficients of thermal expansion having similar values each other, so that a harmful effect of the temperature change which is observed in members having different coefficients of thermal expansion may be prevented.

Although the invention has been described with respect to specific embodiment for complete and clear disclosure, the appended claims are not to thus limited and alternative constructions that may occur to one skilled in the art which fairly fall within the basic teaching herein set forth. For instance, the structure of the chip carrier thus explained may be applied to a semiconductor laser module. In this case, the basic structure is the same as that in the preferred embodiment, except that a driving circuit is provided in the place of the pre-amplifier, and the position of the chip carrier is changed.

What is claimed is:

1. A photoelectric converter module, comprising:
   a photoelectric converter chip to convert an optical signal into an electric signal;
   chip carrier means for carrying said photoelectric converter chip, said chip carrier means comprising a ceramic member having a square pillar shape which carries said photoelectric converter chip on a side surface thereof, a conductor pattern continually provided on said side surface and a top surface of said ceramic member, and a metal member on which said chip carrier means is fixed;
   pre-amplifier means connected with said conductor pattern of said chip carrier means via a bonding wire, for amplifying said electric signal converted by said photoelectric converter chip; and
   metal base means on which said metal member of said chip carrier means is fixed by laser welding and said pre-amplifier means is fixed.

2. A photoelectric converter module, according to claim 1, wherein:
   said metal member projects over said ceramic member at each side end to have projecting parts, and said chip carrier means is fixed on said metal base means by laser welding at said projecting parts.

3. A photoelectric converter module, according to claim 2, wherein:
   said chip carrier means is fixed on said metal base means by welding using YAG laser.

4. A photoelectric converter module, according to claim 1, wherein:
   said metal member and said metal base means consist of the same material.

5. A photoelectric converter module, according to claim 1, wherein:
   said ceramic member consists of alumina ceramic material.

6. A photoelectric converter module, according to claim 1, wherein:
   said metal member and said metal base means consist of alloy of Fe, Ni and Co.

* * * * *